(12) United States Patent
Wang

(10) Patent No.: US 7,586,200 B2
(45) Date of Patent: Sep. 8, 2009

(54) LIGHT EMITTING DIODE CHIP WITH REFLECTIVE LAYER THEREON

(75) Inventor: Jiunheng Wang, Tainan County (TW)

(73) Assignees: ChipMOS Technologies Inc., Hsinchu (TW); ChipMOS Technologies (Bermuda) Ltd., Hamilton (BM)

( * ) Notice: Subject to any disclaimer, the term of this patent is extended or adjusted under 35 U.S.C. 154(b) by 147 days.

(21) Appl. No.: 11/302,737

(22) Filed: Dec. 13, 2005

(65) Prior Publication Data

US 2007/0090388 A1 Apr. 26, 2007

(30) Foreign Application Priority Data

Sep. 15, 2005 (TW) .............................. 94131795 A

(51) Int. Cl.
*H01L 23/48* (2006.01)
*H01L 23/52* (2006.01)
*H01L 29/40* (2006.01)

(52) U.S. Cl. ................ 257/780; 257/431; 257/E33.056

(58) Field of Classification Search ................. 257/778, 257/780, 781, 81, 82, 98, 99, 432–437, E33.056, 257/E33.057, E33.058, E33.059, E25.032, 257/779

See application file for complete search history.

(56) References Cited

U.S. PATENT DOCUMENTS

| 6,117,299 | A * | 9/2000 | Rinne et al. ................. 205/125 |
| 7,075,115 | B2 * | 7/2006 | Sakamoto et al. ............. 257/98 |
| 7,125,788 | B2 * | 10/2006 | Domon et al. .............. 438/613 |
| 2002/0185743 | A1 * | 12/2002 | Gil Baik ..................... 257/777 |

OTHER PUBLICATIONS

Merriam-Webster Online Dictionary www.merriam-webster.com.*

* cited by examiner

*Primary Examiner*—Monica Lewis
(74) *Attorney, Agent, or Firm*—J.C. Patents

(57) ABSTRACT

A light emitting diode including a substrate, a semiconductor layer, multiple electrodes, a passivation layer, multiple under bump metallurgy (UBM) layers and a reflective layer is provided. The semiconductor layer is disposed on the substrate. The electrodes and the passivation layer are disposed on the semiconductor layer. The passivation layer has multiple openings for exposing the electrodes. The UBM layers are disposed on the electrodes. The reflective layer is disposed on the passivation layer. The reflective layer is electrically isolated from the electrodes and the UBM layers. A method of fabricating the light emitting diode is also provided. The reflective layer and the UBM layers are fabricated simultaneously in one process. Therefore, the fabricating method is compatible with the existing process.

5 Claims, 3 Drawing Sheets

LIGHT EMITTING DIODE CHIP WITH REFLECTIVE LAYER THEREON

CROSS-REFERENCE TO RELATED APPLICATION

This application claims the priority benefit of Taiwan application Ser. No. 94,131,795, filed on Sept. 15, 2005. All disclosure of the Taiwan application is incorporated herein by reference.

BACKGROUND OF THE INVENTION

1. Field of the Invention

The present invention relates to a light emitting diode and a fabricating method thereof. More particularly, the present invention relates to a light emitting diode with high light-emitting efficiency and a fabricating method thereof.

2. Description of the Related Art

A light emitting diode (LED) is a semiconductor device fabricated using a group III-V compound semiconductor material, for example. The semiconductor material has a special property capable of converting the electrical energy into optical energy. More specifically, the electrons and holes within the semiconductor material will recombine to release the excessive energy in the form of light when a current is sent through the semiconductor material. Hence, the LED is able to emit light.

Because the light produced by the light emitting diode is a type of cold emission but not thermal emission nor electric discharge, the working life of a light emitting diode device often exceeds a hundred thousand hours. Furthermore, light emitting diodes do not require idling time. In addition, light emitting diode devices have a very high responsive speed (about $10^{-9}$ seconds), a very low degree of pollution (no mercury contained) and very high reliability. Moreover, they are of a very small volume, use very little electricity and are particularly suitable for mass production. With these advantages, the applications of light emitting diodes are far and wide.

In general, a light emitting diode mainly comprises a substrate, a semiconductor layer and a plurality of electrodes. The semiconductor layer is a composite stack comprising a P-type doped layer, an active layer and an N-type doped layer. The semiconductor layer is disposed on the substrate and the electrodes are disposed on the semiconductor layer. When an electric potential is formed between the N-type doped layer and the P-type doped layer, electrons and holes will recombine together in the active layer to produce light.

The light emitting efficiency of the aforesaid light emitting diode depends mainly on the quantum efficiency of the light emitting layer and the light extraction efficiency of the entire light emitting diode. The quantum efficiency of the light emitting layer mainly depends on the epitaxy quality and structure of the light emitting layer and the light extraction efficiency mainly depends on the effective utilization of the light produced by the light-emitting layer (active layer).

To enhance the light extraction efficiency of the light-emitting diode, one conventional technique is to roughen the surface of the light-emitting diode. This technique is typically performed in the post-end production process of the light-emitting diode. The process includes roughening the surface of the light-emitting diode to prevent the occurrence of total internal reflection of light inside the light-emitting diode to reduce the overall light utilization. Because this technique requires an additional roughening process in the fabrication of the light-emitting diode, a higher production cost is incurred and longer production period is required.

In addition, the conventional technique also includes forming a metallic reflective layer between the semiconductor layer and a passivation layer to increase the light extraction efficiency of the light-emitting diode. However, this method still requires the fabrication of an additional metallic reflective layer and hence incurring additional production cost.

SUMMARY OF THE INVENTION

Accordingly, the present invention is directed to provide a light emitting diode with high light emitting efficiency.

The present invention is directed to provide a method of fabricating a light emitting diode having a lower production cost and a shorter production cycle.

As embodied and broadly described herein, the present invention provides a light emitting diode. The light emitting diode comprises a substrate, a semiconductor layer, a plurality of electrodes, a passivation layer, a plurality of under bump metallurgy (UBM) layers and a reflective layer. The semiconductor layer is disposed on the substrate. The electrodes and the passivation layer are disposed on the semiconductor layer. The passivation layer has a plurality of openings for exposing the electrodes. The UBM layers are disposed on the electrodes. The reflective layer is disposed on the passivation layer. The reflective layer is electrically isolated from the electrodes and the UBM layers.

In one embodiment of the present invention, the light emitting diode may further include a plurality of bumps disposed on the UBM layers. The UBM layers are fabricated using a material identical to the reflective layer, for example. More specifically, the UBM layers and the reflective layer are fabricated using, for example, gold, silver, titanium/tungsten or other similar type of material.

The present invention also provides a method of fabricating a light emitting diode. First, a light emitting diode chip is provided. The light emitting diode chip has a plurality of electrodes and a passivation layer. The passivation layer has a plurality of openings that expose the electrodes. Then, a conductive layer is formed on the passivation layer. Thereafter, the conductive layer is patterned to form a plurality of under bump metallurgy (UBM) layers and a reflective layer simultaneously. The UBM layers are disposed on the electrodes and the electrodes and the UBM layers are electrically isolated from the reflective layer.

According to one embodiment of the present invention, the conductive layer may be formed by a sputtering process.

According to one embodiment of the present invention, the method of forming the light emitting diode further includes performing a bump fabricating process to form a bump over each UBM layer. In addition, the aforesaid bump is fabricated by an electroplating or printing process, for example.

In the present invention, a reflective layer is disposed on the passivation layer so that the light emitted from the light emitting diode all travel outwards in approximately the same direction. Therefore, the light emitting diode disclosed in the present invention has higher light extraction efficiency. Furthermore, the reflective layer and the UBM layers are simultaneously formed in the same patterning process. Hence, the present invention is compatible with the existing processes and no additional cost is incurred. Moreover, the process disclosed in the present invention for fabricating the light emitting diode has a lower production cost and a shorter production cycle and yet produces a light emitting diode with higher light extraction efficiency.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1A:
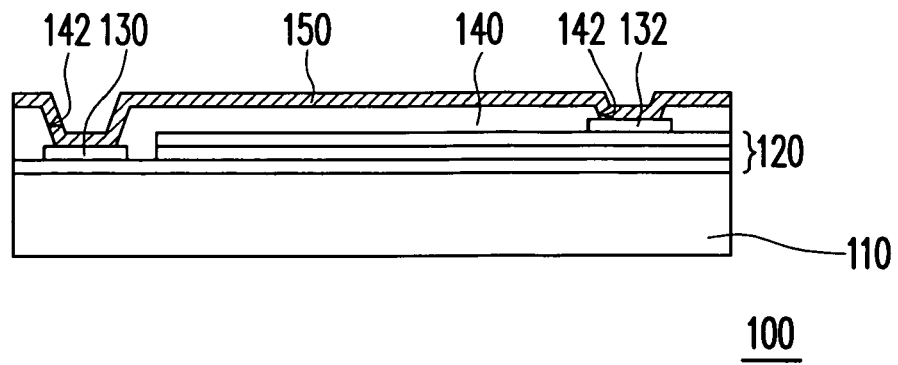
FIGS. 1A and 1B are schematic cross-sectional view showing the steps for producing a light emitting diode according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
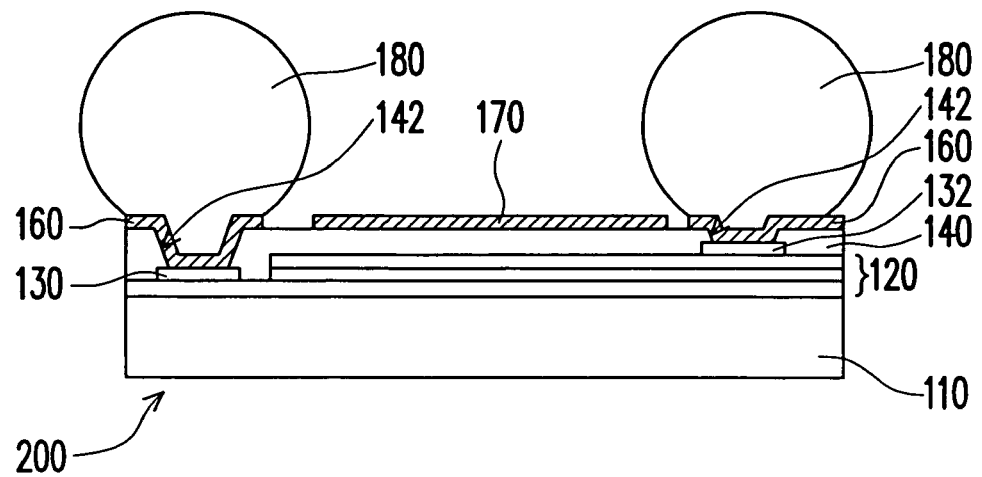

FIGS. 1A and 1B are schematic cross-sectional view showing the steps for producing a light emitting diode according to one embodiment of the present invention. As shown in FIG. 1A, a light emitting diode chip 100 is provided. The light emitting diode chip 100 comprises a substrate 100, a semiconductor layer 120, a plurality of electrodes 130, 103 and a passivation layer 140. The substrate 100 is fabricated using a material including C-plane, R-plane or A-plane mono-crystalline aluminum oxide (Sapphire) or other transparent material, for example. In addition, mono-crystalline compound having a lattice constant close to the nitride semiconductor can also be used as a material for fabricating the substrate 110.

The semiconductor layer 120 is disposed on the substrate 110 and the electrodes 130, 132 are disposed on the semiconductor layer 120. The electrodes 130, 132 are fabricated using materials having good ohmic contact with the semiconductor layer 120 including, for example, titanium/aluminum/titanium/gold (Ti/Al/Ti/Au), titanium/aluminum/platinum/gold (Ti/Al/Pt/Au), chromium/aluminum/platinum/gold (Cr/Al/Pt/Au), chromium/aluminum/titanium/gold (Cr/Al/Ti/Au), palladium/aluminum/titanium/gold (Pd/Al/Ti/Au), palladium/aluminum/platinum/gold (Pd/Al/Pt/Au), neodymium/aluminum/platinum/gold (Nd/Al/Pt/Au), neodymium/aluminum/titanium/gold (Nd/Al/Ti/Au), nickel/aluminum/titanium/gold (Ni/Al/Ti/Au), nickel/aluminum/platinum/gold (Ni/Al/Pt/Au), nickel/aluminum/chromium/gold (Ni/Al/Cr/Au) and so on. The passivation layer 140 is also disposed on the semiconductor layer 120. The passivation layer 140 has a plurality of openings 142 for exposing the electrodes 130, 132.

After providing the light emitting diode chip 100, a conductive layer 150 is formed on the light emitting diode chip 100. The method of forming the conductive layer 150 includes performing a sputtering process, for example. The conductive layer 150 can be fabricated using, for example, gold (Au), silver (Ag) or titanium/tungsten (Ti/W).

As shown in FIG. 1B, the conductive layer 150 is patterned, for example, by performing a photolithographic/etching process so that a plurality of under bump metallurgy (UBM) layers 160 and a reflective layer 170 are simultaneously formed to produce a preliminary light emitting diode 200. The reflective layer 170 is electrically isolated from the electrodes 130, 132 and the UBM layers 160.

Figure 2A:
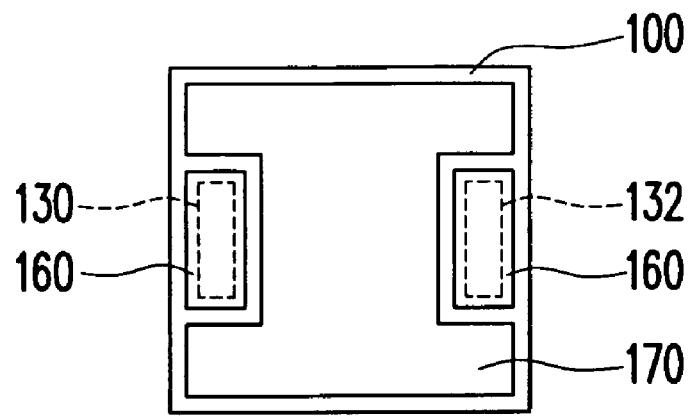
FIGS. 2A and 2B are top views showing the conductive layer after a patterning process.
Figure 2B:
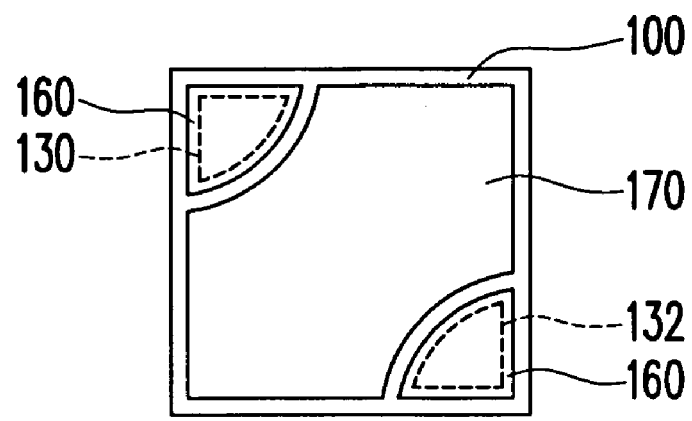

Since the aforesaid UBM layers 160 and the reflective layer 170 are formed by performing a photolithographic/etching process on the conductive layer 150, the shape and disposed locations of the UBM layers 160 and the reflective layer 170 can be flexibly adjusted according to the position of the electrodes 130 and 132 relative to the semiconductor layer 120. FIGS. 2A and 2B are top views showing the conductive layer 150 after a patterning process. For example, in FIG. 2A, when the electrodes 130 and 132 are disposed on the opposing sides of the semiconductor layer 120, the UBM layers 160 are located above the respective electrodes 130 and 132. The reflective layer 170 is located in an area outside the UBM layers 160 on the light emitting diode chip 100. On the other hand, when the electrodes 130 and 132 are disposed on the opposing corners of the semiconductor layer 120, the UBM layers 160 are still disposed on the respective electrodes 130 and 132. However, the shape of the reflective layer 170 can be flexibly changed according to the variation of the shape and location of the UBM layers 160.

Again, as shown in FIG. 1B, after forming the UBM layers 160 and the reflective layer 170 by patterning the conductive layer 150, a bump 180 can be formed on top of each UBM layer 160. The method of forming the bumps 180 includes performing an electroplating process, a screen-printing process or other suitable operations. The bumps 180 are fabricated using gold or solder material, for example.

Accordingly, the light emitting diode disclosed in the present invention mainly comprises a substrate 110, a semiconductor layer 120, a plurality of electrodes 130 and 132, a passivation layer 140, a plurality of under bump metallurgy (UBM) layers 160 and a reflective layer 170. The semiconductor layer 120 is disposed on the substrate 110 and the electrodes 130 and 132 are disposed on the semiconductor layer 120. The passivation layer 140 is also disposed on the semiconductor layer 120 and has a plurality of openings 140 that expose the respective electrodes 130 and 132. The UBM layers 160 are disposed on the electrodes 130 and 132 and the reflective layer 170 is disposed on the passivation layer 140. It should be noted that the reflective layer 170 is electrically isolated from the electrodes 130, 132 and the UBM layers 160.

Figure 3:
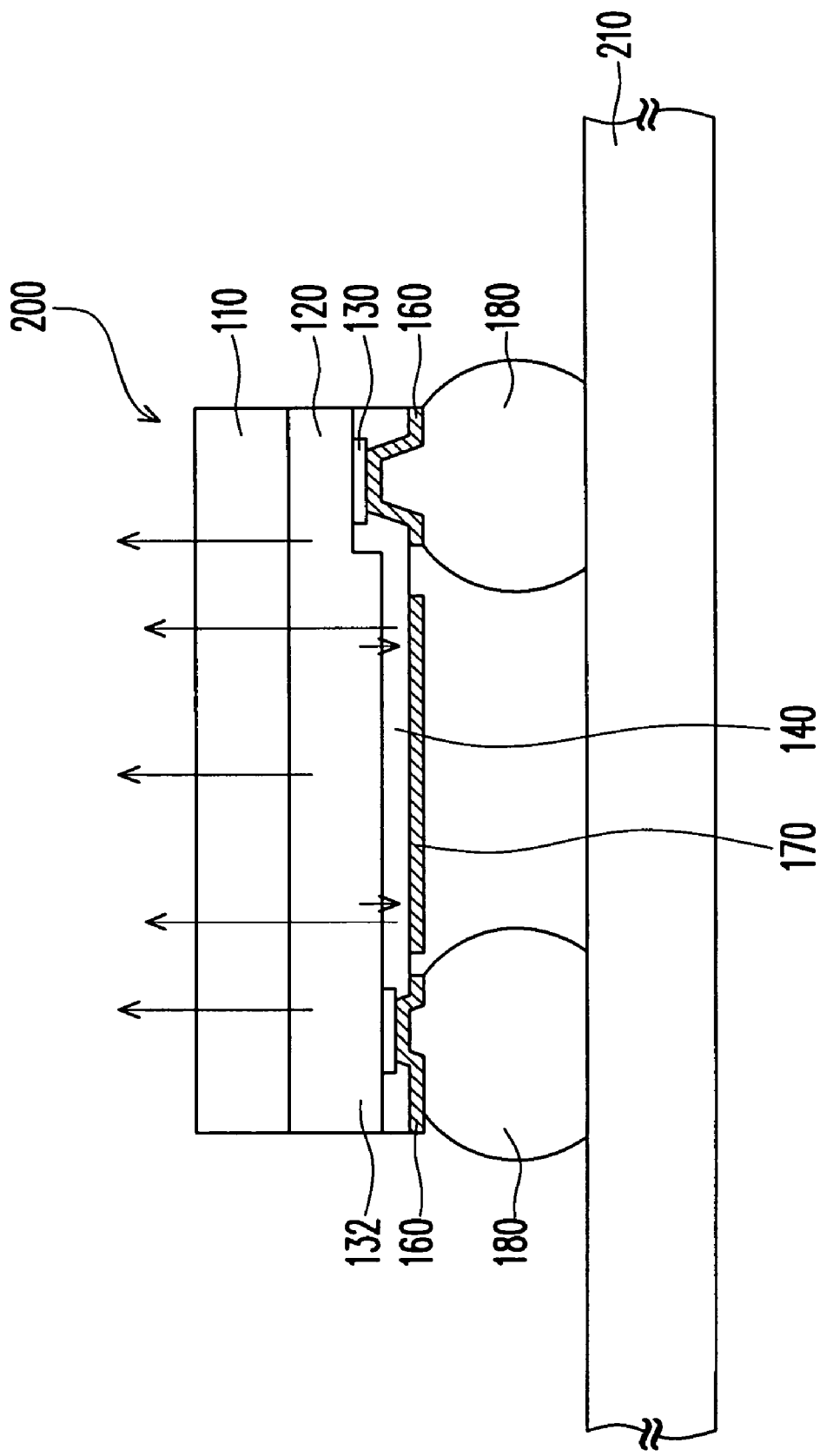
FIG. 3 is a schematic cross-sectional view showing the structure after a light emitting diode is assembled to a carrier substrate.

A light emitting diode 200 electrically connected to a carrier substrate 210 through the bumps 180 is shown in FIG. 3. As shown in FIG. 3, when an electric bias is applied between the electrodes 130 and 132, electrons and holes inside the semiconductor layer 120 will recombine to emit light. Since the semiconductor layer on the light emitting diode in the present embodiment has a reflective layer 170, the light traveling toward the carrier substrate 210 are reflected. Hence, almost all the light emitted by the light emitting diode 200 will emerge in the same direction so that the light emitting diode 200 can have higher light extraction efficiency.

Therefore, the light emitting diode and fabricating method thereof according to the present invention has at least the following advantages:

1. With the reflective layer disposed on the passivation layer, almost all the light produced by the light emitting diode will emerge in the same direction so that the light emitting diode can have higher light extraction efficiency.
2. The reflective layer and the UBM layers are fabricated simultaneously in the same process. Hence, the present invention is compatible with the existing processes without incurring any additional production cost. Moreover, the process disclosed in the present invention for fabricating the light emitting diode has a lower production cost and a shorter production cycle and yet produces a light emitting diode with higher light extraction efficiency.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode, comprising:
   a transparent substrate;
   a semiconductor layer disposed on the transparent substrate, wherein the semiconductor layer comprises at least a lower layer and an upper layer, the lower layer is disposed on the transparent substrate and the upper layer is disposed over the lower layer;
   a plurality of electrodes, wherein the electrodes include at least a first electrode disposed directly on the lower layer of the semiconductor layer and a second electrode disposed directly on the upper layer of the semiconductor layer;
   a passivation layer disposed on the semiconductor layer, wherein the passivation layer has a plurality of openings for exposing the electrodes;
   a plurality of under bump metallurgy layers disposed on the respective electrodes; and
   a reflective layer disposed directly on the passivation layer for reflecting light, wherein the reflective layer is electrically isolated from the electrodes and the under bump metallurgy layers.

2. The light emitting diodes of claim 1, further comprising a plurality of bumps disposed on each of the under bump metallurgy layers.

3. The light emitting diode of claim 2, wherein the under bump metallurgy layer and the reflective layer are fabricated using the same material.

4. The light emitting diode of claim 3, wherein the material of the under bump metallurgy layers and the reflective layer comprises gold, silver or titanium/tungsten.

5. The light emitting diode of claim 1, wherein the reflective layer is to reflect a backward light, which is generated in the light emitting diode.

\* \* \* \* \*